(12) United States Patent
Lee

(10) Patent No.: US 12,368,071 B2
(45) Date of Patent: Jul. 22, 2025

(54) SEMICONDUCTOR DEVICE AND METHOD FOR FABRICATING THE SAME

(71) Applicant: SK hynix Inc., Gyeonggi-do (KR)

(72) Inventor: Byung Ho Lee, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 506 days.

(21) Appl. No.: 17/899,704

(22) Filed: Aug. 31, 2022

(65) Prior Publication Data

US 2023/0290847 A1    Sep. 14, 2023

(30) Foreign Application Priority Data

Mar. 11, 2022  (KR) .................. 10-2022-0030580

(51) Int. Cl.
*H01L 21/764*    (2006.01)
*H10B 63/00*    (2023.01)
*H10D 62/10*    (2025.01)
*H10D 64/27*    (2025.01)
*H10D 64/66*    (2025.01)
*H10D 64/68*    (2025.01)
*H01L 21/304*    (2006.01)
*H10D 30/66*    (2025.01)

(52) U.S. Cl.
CPC ........... *H01L 21/764* (2013.01); *H10B 63/30* (2023.02); *H10D 62/115* (2025.01); *H10D 62/116* (2025.01); *H10D 64/513* (2025.01); *H10D 64/679* (2025.01); *H10D 64/687* (2025.01); *H01L 21/304* (2013.01); *H10D 30/668* (2025.01); *H10D 62/127* (2025.01)

(58) Field of Classification Search
CPC ... H01L 21/764; H01L 21/304; H10D 62/115; H10D 62/116; H10D 64/679; H10D 64/687; H10D 64/513; H10D 30/668; H10B 63/30
See application file for complete search history.

(56) References Cited

U.S. PATENT DOCUMENTS

2012/0187410 A1* 7/2012 Yamazaki .......... H10D 30/6755
257/66

FOREIGN PATENT DOCUMENTS

KR    10-2018-0056031 A    5/2018

* cited by examiner

*Primary Examiner* — Joseph C. Nicely
(74) *Attorney, Agent, or Firm* — IP & T GROUP LLP

(57) ABSTRACT

A semiconductor device includes: a semiconductor layer, a gate insulating layer, and a gate electrode sequentially formed in a trench formed to a predetermined depth from a first surface of a first substrate; a third substrate bonded to a second surface opposite to the first surface of the first substrate; and an air gap interposed between the semiconductor layer and the first substrate and between the semiconductor layer and the third substrate.

16 Claims, 13 Drawing Sheets

SEMICONDUCTOR DEVICE AND METHOD FOR FABRICATING THE SAME

CROSS-REFERENCE TO RELATED APPLICATION

This application claims priority under 35 U.S.C. § 119 to Korean Patent Application No. 10-2022-0030580 filed on Mar. 11, 2022, which is incorporated herein by reference in its entirety.

BACKGROUND

1. Technical Field

This patent document relates to a semiconductor technology, and more particularly, to a semiconductor device including a transistor, and a method for fabricating the same.

2. Related Art

With the development of the electronic industry, electronic products are gradually miniaturized, increasing in performance, and highly integrated, while the operating speed of the electronic products is required to increase.

In order to satisfy this demand, it is necessary to develop a technology capable of maintaining and/or improving characteristics of a transistor as a unit element constituting the electronic product while reducing the size of the transistor.

SUMMARY

In one embodiment, a semiconductor device may include: a semiconductor layer, a gate insulating layer, and a gate electrode sequentially formed in a trench formed to a predetermined depth from a first surface of a first substrate; a third substrate bonded to a second surface opposite to the first surface of the first substrate; and an air gap interposed between the semiconductor layer and the first substrate and between the semiconductor layer and the third substrate.

In another embodiment, a method for fabricating a semiconductor device, may include: forming a trench in a first substrate to a predetermined depth from a first surface of the first substrate; forming a sacrificial layer along a surface of the trench; sequentially forming a semiconductor layer, a gate insulating layer, and a gate electrode in the trench; forming an insulating layer over the first surface of the first substrate; bonding the insulating layer to a second substrate; thinning the first substrate from a second surface opposite to the first surface of the first substrate to expose the sacrificial layer; forming an air gap by removing the sacrificial layer; bonding the thinned surface of the first substrate to a third substrate; and removing the second substrate.

DETAILED DESCRIPTION

Figure 1:
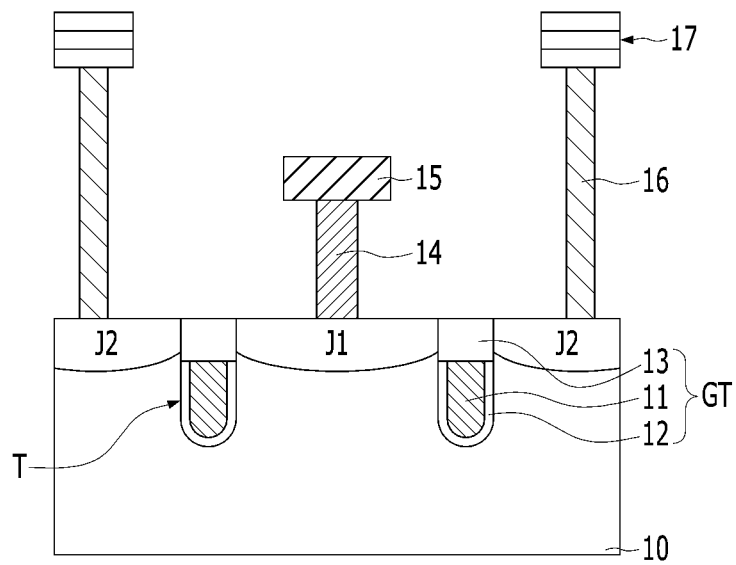
FIG. 1 is a cross-sectional view illustrating a semiconductor device according to one embodiment of the present disclosure.

Hereinafter, various embodiments of the disclosure will be described in detail with reference to the accompanying drawings.

The drawings are not necessarily drawn to scale. In some instances, proportions of at least some structures in the drawings may have been exaggerated in order to clearly illustrate certain features of the described embodiments. In presenting a specific example in a drawing or description having two or more layers in a multi-layer structure, the relative positioning relationship of such layers or the sequence of arranging the layers as shown reflects a particular implementation for the described or illustrated example, and a different relative positioning relationship or sequence of arranging the layers may be possible. In addition, a described or illustrated example of a multi-layer structure might not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

FIG. 1 is a cross-sectional view illustrating a semiconductor device according to one embodiment of the present disclosure.

Referring to FIG. 1, the semiconductor device in one embodiment of the present disclosure may include a substrate 10, a gate structure GT, a bit line contact 14, a bit line 15, a storage node contact 16, and a storage node 17.

The substrate 10 may include a semiconductor material such as silicon. As an example, the substrate 10 may be a bulk silicon substrate.

The gate structure GT may be formed in the substrate 10, and may include a gate electrode 11, a gate insulating layer 12, and a gate protection layer 13.

The gate insulating layer 12 may be formed along a surface of a trench T that is formed in the substrate 10. The gate insulating layer 12 may be formed from a lower surface of the trench T to a predetermined height downward from an upper surface of the substrate 10. The gate insulating layer 12 may include various insulating materials, for example, a silicon oxide layer, a silicon nitride layer, a silicon oxynitride layer, a high-k material, or a combination thereof. The high-k material may include a material having a higher dielectric constant than silicon dioxide ($SiO_2$), for example, $HfO_2$, $HfSiO_4$, $HfAlO$, $ZrO_2$, $ZrSiO_4$, $TaO_2$, $Ta_2O_5$, $Al_2O_3$, or the like.

The gate electrode 11 may be formed in the trench T in which the gate insulating layer 12 is formed. The gate electrode 11 may be formed to fill a portion of the trench T in which the gate insulating layer 12 is formed. The gate electrode 11 may be formed to have an upper surface having a height equal to or similar to that of the gate insulating layer 12. The gate electrode 11 may include various conductive materials, for example, a metal such as platinum (Pt), tungsten (W), aluminum (Al), copper (Cu), tantalum (Ta), titanium (Ti), ruthenium (Ru), or molybdenum (Mo), a metal nitride such as titanium nitride (TiN) or tantalum nitride (TaN), or a combination thereof.

The gate protection layer 13 may be formed to fill the remaining space of the trench T in which the gate electrode 11 and the gate insulating layer 12 are formed. The gate protection layer 13 may protect the gate electrode 11 and the gate insulating layer 12 by covering them. The gate protection layer 13 may include various insulating materials, for example, a silicon nitride layer, a silicon oxynitride layer, or a combination thereof.

The trench T and the gate structure GT may have a line shape extending in a direction penetrating the cross-section of FIG. 1. The gate electrode 11 may function as a word line.

One gate structure GT and first and second junction regions 31 and 32 (formed in the substrate 10 on both sides of the one gate structure GT) may form one transistor. One of the first and second junction regions 31 and 32 may function as a source region and the other of the first and second junction regions 31 and 32 may function as a drain region.

The bit line contact 14 may be connected to one of the first and second junction regions 31 and 32 of the transistor, for example, the first junction region 31, and the storage node contact 16 may be connected to the other one of the first and second junction regions 31 and 32 of the transistor, for example, the second junction region 32. In the disclosed embodiment of FIG. 1, a case has been described in which two transistors share the first junction region 31 positioned between two gate structures GT and the bit line contact 14 connected thereto. However, the present disclosure is not limited thereto, and the two transistors may not share a junction region. Each of the bit line contact 14 and the storage node contact 16 may include various conductive materials, for example, a metal such as platinum (Pt), tungsten (W), aluminum (Al), copper (Cu), tantalum (Ta), titanium (Ti), ruthenium (Ru), or molybdenum (Mo), a metal nitride such as titanium nitride (TiN) or tantalum nitride (TaN), or a combination thereof.

The bit line 15 may be formed over the bit line contact 14 to connect with the bit line contact 14. The bit line 15 may extend in the same direction as the gate electrode 11 functioning as a word line or in a direction crossing the gate electrode 11 at a predetermined angle. The bit line 15 may include various conductive materials, for example, a metal such as platinum (Pt), tungsten (W), aluminum (Al), copper (Cu), tantalum (Ta), titanium (Ti), ruthenium (Ru), or molybdenum (Mo), a metal nitride such as titanium nitride (TiN) or tantalum nitride (TaN), or a combination thereof.

The storage node 17 may be formed over the storage node contact 16 to connect with the storage node contact 16. The storage node 17 may be a part for storing data, and may include various components. As an example, the storage node 17 may include a capacitor in which an insulating material is interposed between two electrodes. However, the present disclosure is not limited thereto, and the storage node 17 may include a variable resistance element that stores different data by switching in different resistance or resistive states. The variable resistance element may include various materials used in Resistive Random Access Memory (RRAM), Phase Change Random Access Memory (PRAM), Ferroelectric Random Access Memory (FRAM), Magnetoresistive Random Access Memory (MRAM), or the like, for example, a metal oxide such as a transition metal oxide or a perovskite-based material, a phase change material such as a chalcogenide-based material, a ferroelectric material, a ferromagnetic material, or the like. When the storage node 17 includes the variable resistance element, an upper end of the storage node 17 may be electrically connected to another conductive line, and may be driven by a voltage or current supplied through another conductive line and the transistor.

In the semiconductor device of FIG. 1, a parasitic capacitance may be generated between the adjacent gate electrodes 11. Such parasitic capacitance may increase as a degree of integration of the semiconductor device increases, thereby exacerbating a resistance-capacitance (RC) delay. In addition, during operation of the transistor, current leakage (in which current flowing through the channel of the transistor leaks to the substrate 10) may occur, thereby interfering with the normal operation of the transistor. In the following embodiments, a semiconductor device capable of reducing a parasitic capacitance while simultaneously reducing current leakage, and a method for fabricating the same will be described.

FIGS. 2 to 8 are cross-sectional views illustrating a semiconductor device and a method for fabricating the same according to another embodiment of the present disclosure.

First, a fabricating method will be described.

Figure 2:
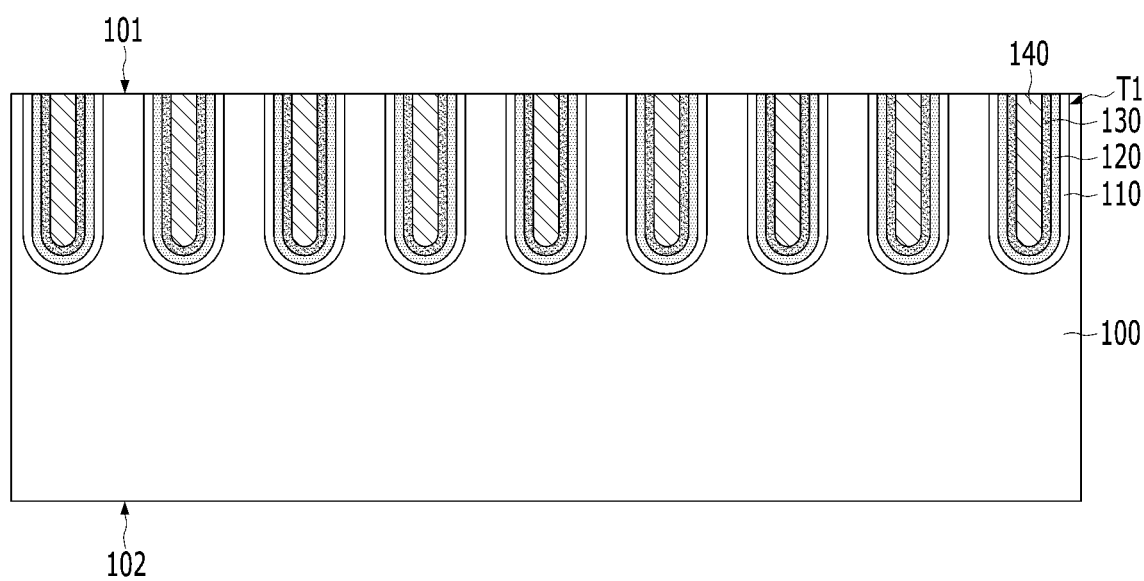
FIGS. 2 to 8 are cross-sectional views illustrating a semiconductor device and a method for fabricating the same according to another embodiment of the present disclosure.

Referring to FIG. 2, a first substrate 100 may be provided. The first substrate 100 may include a semiconductor material such as silicon. As an example, the first substrate 100 may be a substrate including bulk silicon or a wafer. The first substrate 100 may include a first surface 101 and a second surface 102 positioned in opposite directions in a thickness direction of the first substrate 100. That is, a distance between the first surface 101 and the second surface 102 may correspond to a thickness of the first substrate 100. In this process step, the first substrate 100 may be disposed with the first surface 101 facing upward.

Subsequently, the first substrate 100 may be selectively etched to form a trench T1 in the first substrate 100. The etching process for forming the trench T1 may be performed so that the trench T1 has a predetermined depth smaller than the thickness of the first substrate 100 and extending from the first surface 101 of the first substrate 100.

Subsequently, a sacrificial layer 110, a semiconductor layer 120, a gate insulating layer 130, and a gate electrode 140 may be formed in the trench T1.

The sacrificial layer 110 may be formed to a thickness that does not completely fill the trench T1 along a surface of the trench T1. The sacrificial layer 110 may be a portion to be replaced with an air gap by being removed in a subsequent process, and may include a material that is can be removed selectively. In other words, when the sacrificial layer 110 is removed, damage to other components, such as the substrate 100, the semiconductor layer 120, and the insulating layer 150 to be described later, may be prevented or minimized. As an example, the sacrificial layer 110 may include a semiconductor material doped with a high concentration of impurities. The impurities may include boron (B) or the like, and the high concentration may be, for example, $1E18/cm^3$ to $1E19/cm^3$. When a semiconductor material doped with a high concentration of impurities is used as the sacrificial layer 110, only the sacrificial layer 110 may be removed by using a chemical having a high selectivity with respect to the substrate 100 and/or the semiconductor layer 120 including a semiconductor material doped with a low concentration or undoped, and with respect to an insulating layer 150 including silicon nitride, etc. However, the present disclosure is not limited thereto, and as the sacrificial layer 110, various materials having a higher etching rate in a specific etching gas or chemical than the substrate 100, the semiconductor layer 120, and the insulating layer 150 may be used. In the present embodiment, the sacrificial layer 110 may be formed by various deposition methods, such as atomic layer deposition (ALD), chemical vapor deposition (CVD), or the like. However, the present disclosure is not limited thereto, and a sacrificial layer may be formed by doping the first substrate 100 with impurities at a high concentration. This will be described later with reference to FIGS. 13 and 14.

The semiconductor layer 120 may be formed over the sacrificial layer 110 along the sacrificial layer 110, and may be formed to a thickness that does not completely fill the trench T1. The semiconductor layer 120 may serve to provide a channel region and a junction region of the transistor, and may include various semiconductor materials. The semiconductor layer 120 may include the same semiconductor material as the substrate 100, for example, silicon, but the present disclosure is not limited thereto. In another embodiment, the semiconductor layer 120 may include a semiconductor material different from that of the substrate 100. In addition, the semiconductor layer 120 may include an undoped semiconductor material or a lightly doped semiconductor material. The semiconductor layer 120 may be formed by a deposition method or an epitaxial growth method.

The gate insulating layer 130 may be formed over the semiconductor layer 120 along the semiconductor layer 120, and may be formed to a thickness that does not completely fill the trench T1. The gate insulating layer 130 may include various insulating materials, for example, a silicon oxide layer, a silicon nitride layer, a silicon oxynitride layer, a high-k material, or a combination thereof. The high-k material may include a material having a higher dielectric constant than silicon dioxide ($SiO_2$), for example, $HfO_2$, $HfSiO_4$, $HfAlO$, $ZrO_2$, $ZrSiO_4$, $TaO_2$, $Ta_2O_5$, $Al_2O_3$, or the like. The gate insulating layer 130 may be formed by various deposition methods.

The gate electrode 140 may be formed to fill the remaining space of the trench T1 in which the sacrificial layer 110, the semiconductor layer 120, and the gate insulating layer 130 are formed. The gate electrode 140 may include various conductive materials, for example, a metal such as platinum (Pt), tungsten (W), aluminum (Al), copper (Cu), tantalum (Ta), titanium (Ti), ruthenium (Ru), or molybdenum (Mo), a metal nitride such as titanium nitride (TiN) or tantalum nitride (TaN), or a combination thereof. The gate electrode 140 may be formed by various deposition methods.

At least one of the sacrificial layer 110, the semiconductor layer 120, the gate insulating layer 130, and the gate electrode 140 may extend onto the first surface 101 of the first substrate 100 according to a formation method. In this case, immediately after forming at least one of the sacrificial layer 110, the semiconductor layer 120, the gate insulating layer 130, and the gate electrode 140, or after forming the gate electrode 140, a planarization process may be performed so that the first surface 101 of the first substrate 100 is exposed. The planarization process may be performed by a polishing process such as chemical mechanical polishing (CMP) or an etch-back process. As a result of this process, the sacrificial layer 110, the semiconductor layer 120, the gate insulating layer 130, and the gate electrode 140 may have exposed surfaces, for example, respective upper surfaces that are substantially planarized with the first surface 101 of the first substrate 100. However, the present disclosure is not limited thereto, and at least one of the exposed surfaces of the sacrificial layer 110, the semiconductor layer 120, the gate insulating layer 130, and the gate electrode 140, and the first surface 101 of the first substrate 100 that are facing the same direction, for example, facing upward, may be located at different levels.

Figure 3:
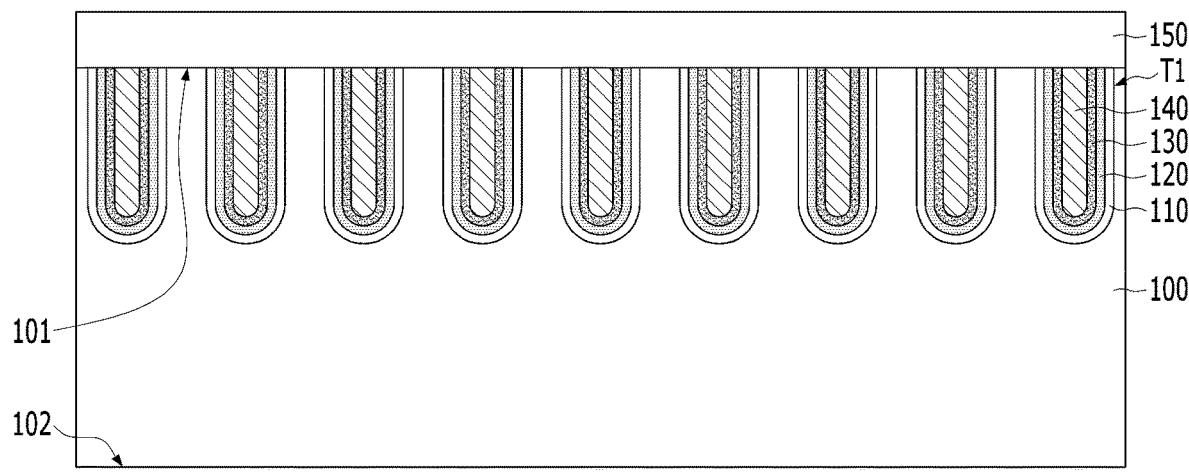

Referring to FIG. 3, an insulating layer 150 may be formed over the process resultant structure of FIG. 2, that is, over the first surface 101 of the first substrate 100, and the exposed surfaces of the sacrificial layer 110, the semiconductor layer 120, the gate insulating layer 130, and the gate electrode 140.

The insulating layer 150 may function as a part to be bonded to a second substrate in a bonding process to be described later (refer to FIG. 4). In addition, the insulating layer 150 may also function as a support that contacts and supports the semiconductor layer 120, the gate insulating layer 130, and the gate electrode 140 during a partial removal process of the first substrate 100 to be described later (refer to FIG. 4).

The insulating layer 150 may include various insulating materials, for example, silicon nitride, silicon carbon nitride, or a combination thereof.

Figure 4:
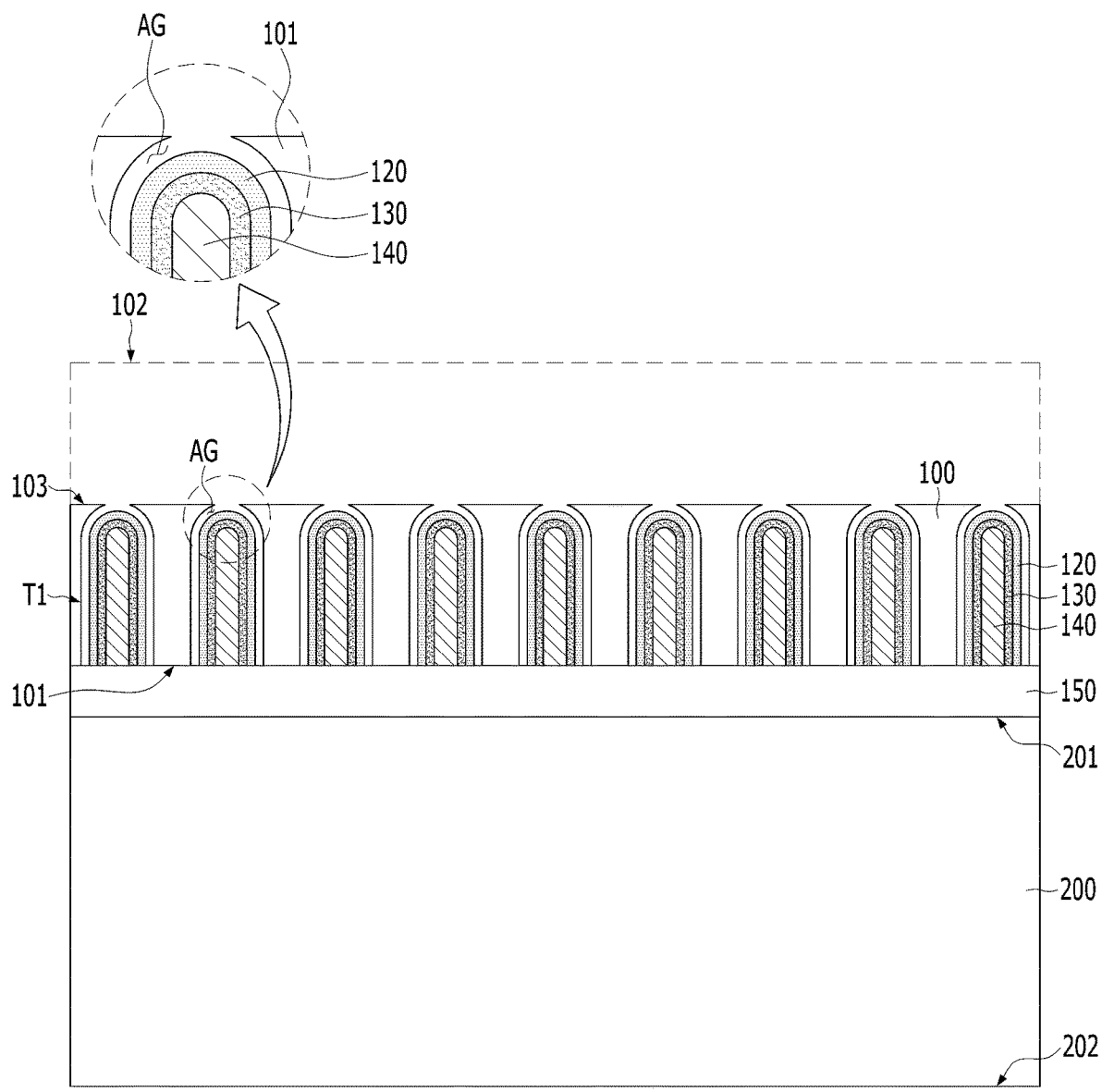

Referring to FIG. 4, the process resultant structure of FIG. 3 may be turned upside down. That is, in a state in which the insulating layer 150 is formed over the first surface 101 of the first substrate 100, the first substrate 100 may be disposed so that the second surface 102 faces upward and the first surface 101 faces downward. As a result, the insulating layer 150 may be disposed under the first surface 101 of the first substrate 100.

Subsequently, the process resultant structure of FIG. 3 may be bonded to a second substrate 200 in the upside-down state. The second substrate 200 may include a semiconductor material such as silicon. As an example, the second substrate 200 may be a substrate including bulk silicon or a wafer. The second substrate 200 may be formed of the same material as the first substrate 100. The second substrate 200 may include a first surface 201 and a second surface 202 positioned in opposite directions in a thickness direction of the second substrate 200. In this process step, the second substrate 200 may be disposed with the first surface 101 facing upward. As a result, the insulating layer 150 under the first surface 101 of the first substrate 100 may be attached on the first surface 201 of the second substrate 200.

Subsequently, the first substrate 100 may be thinned by removing a portion of the first substrate 100 from the second surface 102 of the first substrate 100. The thinning of the first substrate 100 may be performed by a polishing process such as CMP, a grinding process, or a combination thereof. The removed portion of the first substrate 100 is indicated by the dotted line shown in FIG. 4. Through this thinning process, the first substrate 100 may have a third surface 103 positioned below the second surface 102 by a predetermined degree, as shown in FIG. 4.

Here, the thinning of the first substrate 100 may be performed so that the sacrificial layer 110 is exposed. Accordingly, the third surface 103 of the first substrate 100 may be positioned at substantially the same level as the uppermost surface of the sacrificial layer 110.

Subsequently, the air gap AG may be formed by removing the sacrificial layer 110 (which had been exposed by the thinning of the first substrate 100). The removal of the sacrificial layer 110 may be performed using a method that selectively removed the sacrificial layer, depending on the type of the sacrificial layer 110. That is, the removal of the sacrificial layer 110 may be performed by an etching method having a higher etch rate compared to an etching rate of the substrate 100, the semiconductor layer 120, the insulating layer 150, or the like. When the sacrificial layer 110 includes a semiconductor material doped with a high concentration of impurities, it may be removed by a wet etching method using a chemical having a high selectivity compared to a semiconductor material doped with a low concentration or undoped, silicon oxide, silicon nitride, or the like.

As a result of this process, the semiconductor layer 120, the gate insulating layer 130, and the gate electrode 140 may be surrounded by the air gap AG, except for the respective surfaces facing and in contact with the insulating layer 150, and thus, may be separated from the first substrate 100 by the air gap AG.

Figure 5:
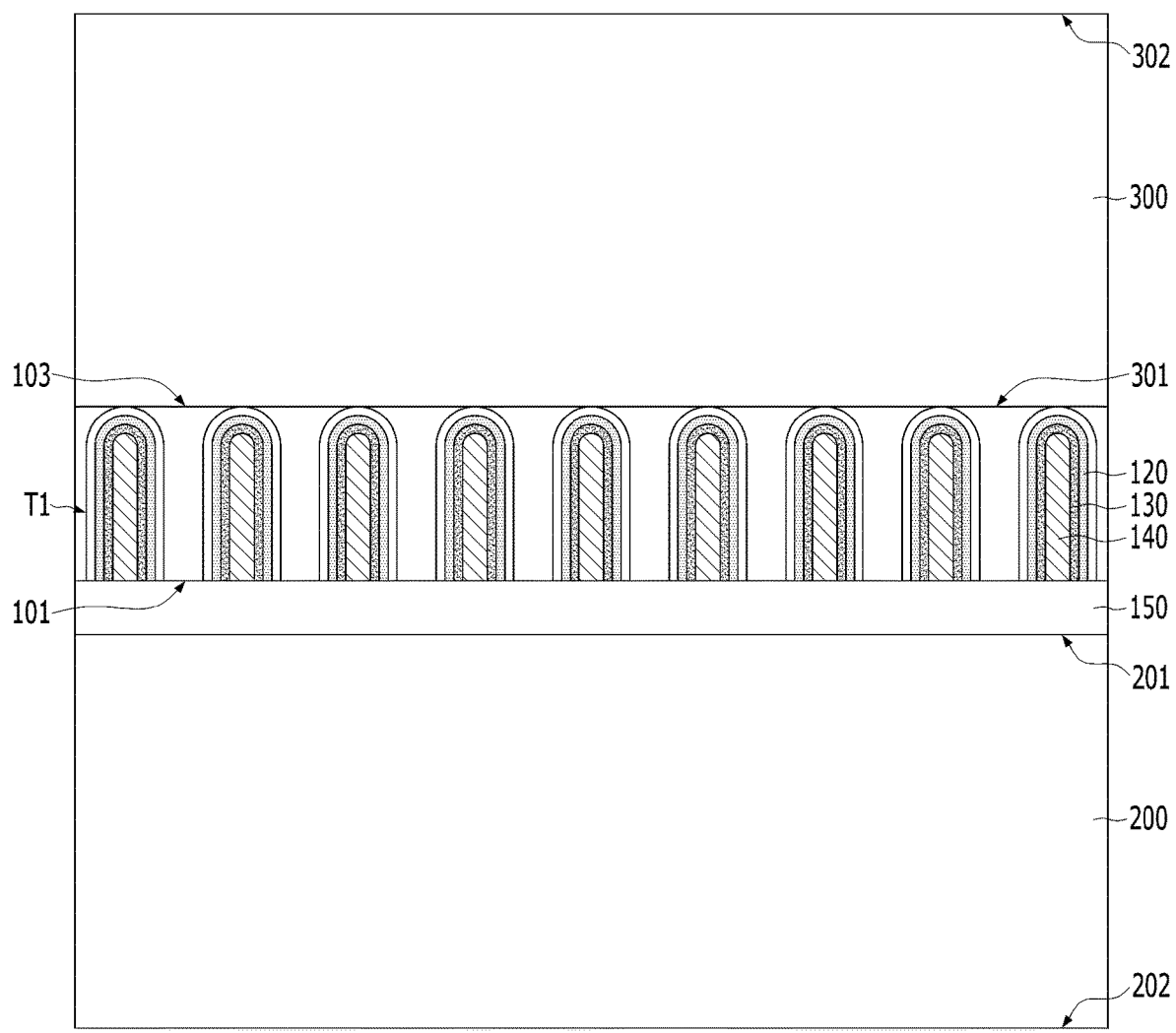

Referring to FIG. 5, a third substrate 300 may be bonded over the process resultant structure of FIG. 4. The third substrate 300 may include a semiconductor material such as silicon. As an example, the third substrate 300 may be a substrate including bulk silicon or a wafer. The third substrate 300 may include the same material as the first substrate 100 and the second substrate 200. The third substrate 300 may include a first surface 301 and a second surface 302 positioned in opposite directions in a thickness direction of the third substrate 300. In this process step, the third substrate 300 may be disposed with the first surface 301 facing downward as shown in FIG. 5. As a result, the first surface 301 of the third substrate 300 may cover the air gap AG while being attached to the third surface 103 of the first substrate 100. When the third substrate 300 is formed, the air gap AG may be substantially maintained.

Figure 6:
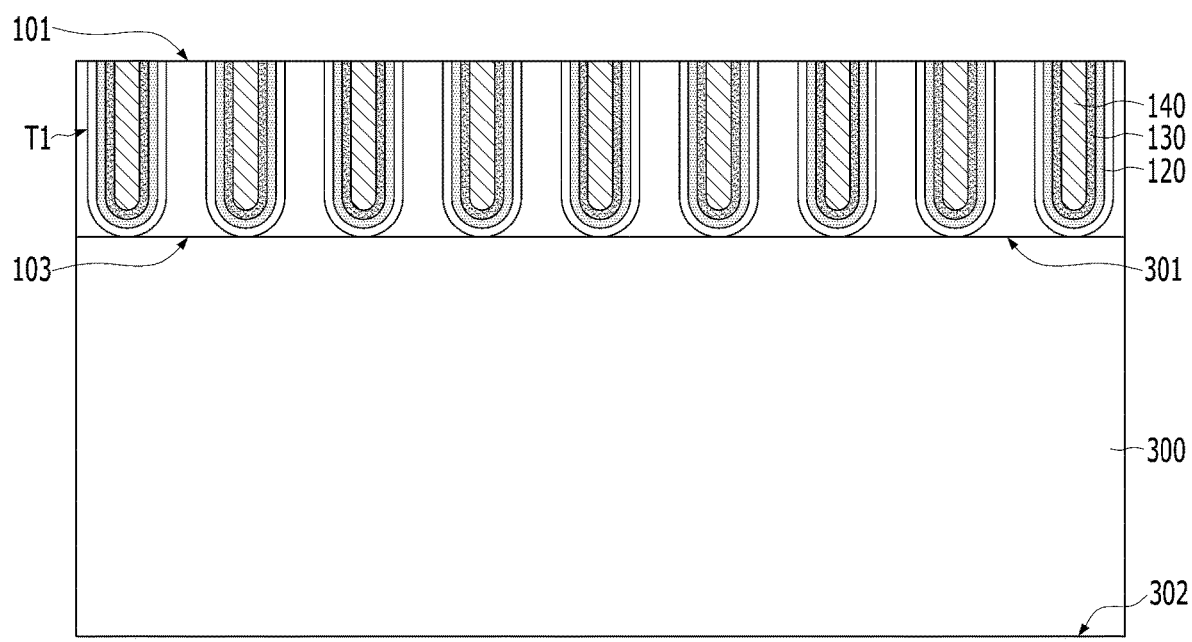

Referring to FIG. 6, after turning over the process resultant structure of FIG. 5, the second substrate 200 may be removed. The removal of the second substrate 200 may be performed by using a laser or the like to separate the second substrate 200 from the insulating layer 150. Subsequently, the insulating layer 150 may be removed. However, the present disclosure is not limited thereto, and the insulating layer 150 may be maintained.

As a result of this process, as shown in FIG. 6, the third substrate 300 may be disposed with the first surface 301 facing upward and the second surface 302 facing downward, and the first substrate 100 may be disposed with the first surface 101 facing upward and the third surface 103 facing downward over the first surface 301 of the third substrate 300. Accordingly, the first surface 301 of the third substrate 300 and the third surface 103 of the first substrate 100 may contact each other. The gate electrode 140, the gate insulating layer 130, the semiconductor layer 120, and the air gap AG may be disposed in the first substrate 100, and may include upper surfaces forming a substantially flat surface with the first surface 101 of the first substrate 100. A remaining surface of the gate electrode 140, except for the upper surface of the gate electrode 140, may be surrounded by the gate insulating layer 130. An outer surface of the gate insulating layer 130, except for the upper surface of the gate insulating layer 130 and an inner surface in contact with the gate electrode 140 of the gate insulating layer 130, may be surrounded by the semiconductor layer 120. An outer surface of the semiconductor layer 120, except for the upper surface of the semiconductor layer 120 and an inner surface of the semiconductor layer 120 in contact with the gate insulating layer 130, may be surrounded by the air gap AG. Assuming that the gate electrode 140, the gate insulating layer 130, the semiconductor layer 120, and the air gap AG form a first structure ST1, a length and/or thickness of the first structure ST1 in a vertical direction may be substantially the same as a thickness of the first substrate 100.

Figure 7:
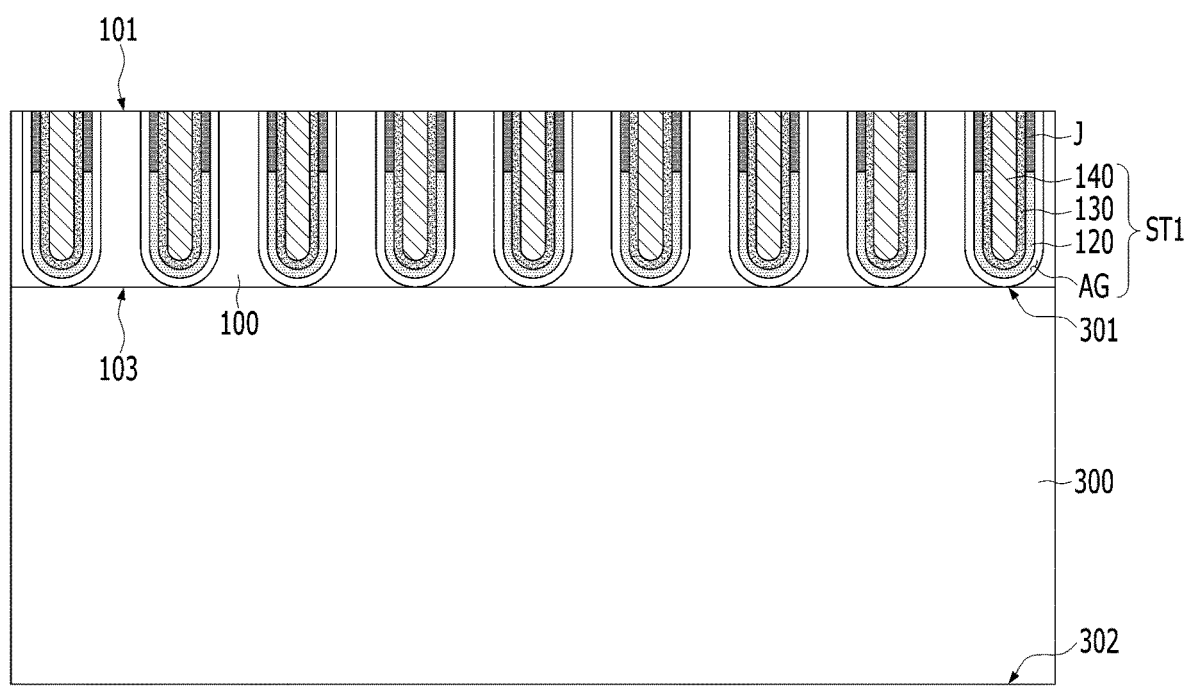

Referring to FIG. 7, a junction region J may be formed by doping the semiconductor layer 120 with impurities. Doping of the impurities may be performed using a mask pattern exposing the semiconductor layer 120 or may be performed without a mask pattern. When the impurities are doped without a mask pattern, the first substrate 100 may also be doped with the impurities, but the first substrate 100 is separated from the semiconductor layer 120 by the air gap AG, so the impurities of the first substrate 100 may not affect the operation of the transistor. Two junction regions J of the semiconductor layer 120 may function as a source region and a drain region, respectively, and a portion between them may function as a channel region.

Figure 8:
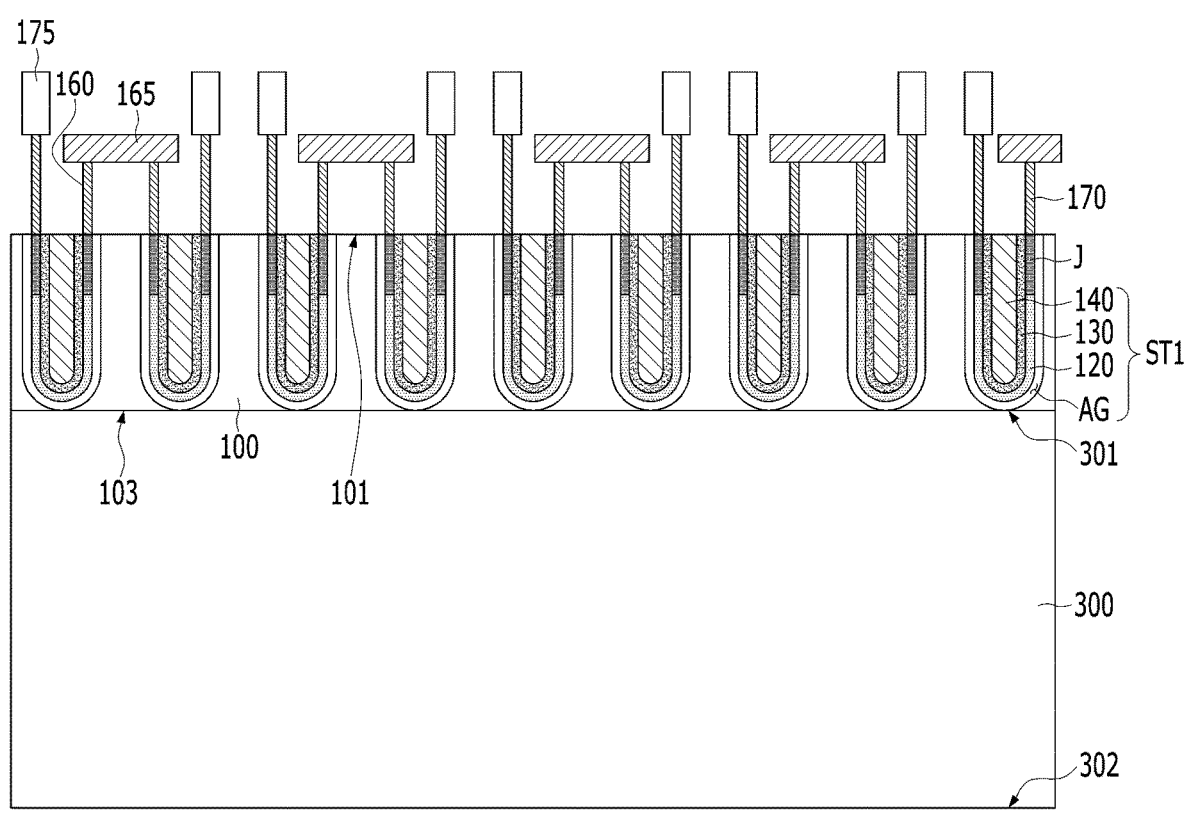

Referring to FIG. 8, a bit line contact 160, a bit line 165, a storage node contact 170, and a storage node 175 may be formed.

The bit line contact 160 may be connected to one of the two junction regions J of the transistor, and the storage node contact 170 may be connected to the other of the two junction regions J of the transistor. Each of the bit line contact 160 and the storage node contact 170 may include various conductive materials, for example, a metal such as platinum (Pt), tungsten (W), aluminum (Al), copper (Cu), tantalum (Ta), titanium (Ti), ruthenium (Ru), or molybdenum (Mo), a metal nitride such as titanium nitride (TiN) or tantalum nitride (TaN), or a combination thereof.

The bit line 165 may be formed over the bit line contact 160 to be connected to the bit line contact 160. One bit line 165 may be simultaneously connected to two bit line contacts 160 adjacent to each other, but the present disclosure is not limited thereto. The bit line 165 may include various conductive materials, for example, a metal such as platinum (Pt), tungsten (W), aluminum (Al), copper (Cu), tantalum (Ta), titanium (Ti), ruthenium (Ru), or molybdenum (Mo), a metal nitride such as titanium nitride (TiN) or tantalum nitride (TaN), or a combination thereof.

The storage node 175 may be formed over the storage node contact 170 to connect with the storage node contact 170. The storage node 175 may be a part for storing data, and may include various components. As an example, the storage node 175 may include a capacitor in which an insulating material is interposed between two electrodes. However, the present disclosure is not limited thereto, and the storage node 175 may include a variable resistance element that stores different data by switching in different resistance states. The variable resistance element may include various materials used in RRAM, PRAM, FRAM, MRAM, or the like, for example, a metal oxide such as a transition metal oxide or a perovskite-based material, a phase change material such as a chalcogenide-based material, a ferroelectric material, a ferromagnetic material, or the like. When the storage node 175 includes a variable resistance element, an upper end of the storage node 175 may be electrically connected to another conductive line, and may be driven by a voltage or current supplied through another conductive line and the transistor.

Thereby, a semiconductor device as shown in FIG. 8 may be provided.

Referring back to FIG. 8, the semiconductor device of the one embodiment may include a stacked structure of the third substrate 300 and the first substrate 100. The first structure ST1 including the gate electrode 140, the gate insulating layer 130, the semiconductor layer 120, and the air gap AG may be disposed in the first substrate 100. Respective surfaces, for example, the upper surfaces, of the gate electrode 140, the gate insulating layer 130, and the semiconductor layer 120 may face upward, and the air gap AG may surround the remaining surface, except for the upper surface of the semiconductor layer 120. Accordingly, the air gap AG may be interposed between the first substrate 100 and the semiconductor layer 120 and also between the third substrate 300 and the semiconductor layer 120.

The two junction regions J may be formed in each semiconductor layer 120 to a predetermined depth from the one surface of the semiconductor layer 120. One of the two junction regions J of the semiconductor layer 120 may be connected to the bit line 165 through the bit line contact 160, and the other of the two junction regions J of the semiconductor layer 120 may be connected to the storage node 175 through the storage node contact 170. The bit line contact 160 and the storage node contact 170 may be formed to pass through an insulating material to be connected to the junction regions J. If the above-described insulating layer 150 is present, the bit line contact 160 and the storage node contact 170 may be formed to pass through the insulating layer 150. These memory components are contained in and supported by first substrate 100 otherwise referred to as a device substrate. In turn, the first substrate 100 is supported by third substrate 300 otherwise referred to as a base substrate supporting the device substrate.

Since the components of FIG. 8 have already been described in the process of explaining the fabricating method, detailed descriptions thereof will be omitted.

According to the semiconductor device and the fabricating method described above, in one embodiment of the present disclosure, since the air gap AG is interposed between the adjacent gate electrodes 140, the parasitic capacitance therebetween may be reduced, thereby reducing or preventing the RC delay. Furthermore, in another embodiment of the present disclosure, since the semiconductor layer 120 including the junction regions J and the channel region therebetween is separated from the first substrate 100 and the third substrate 300 by the air gap AG, the current leakage in which the current flowing through the channel of the transistor exits to the first substrate 100 and/or the third substrate 300 may be blocked. As a result, the operating characteristics of the transistor may be improved.

Figure 9:
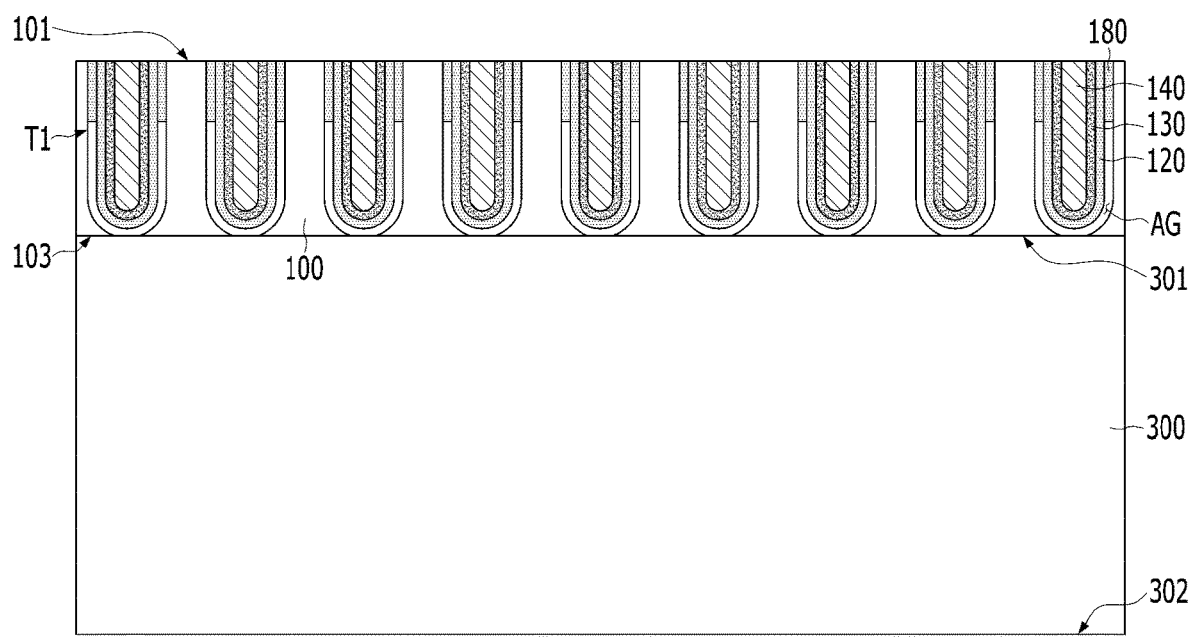
FIGS. 9 to 11 are cross-sectional views illustrating a semiconductor device and a method for fabricating the same according to another embodiment of the present disclosure.
Figure 10:
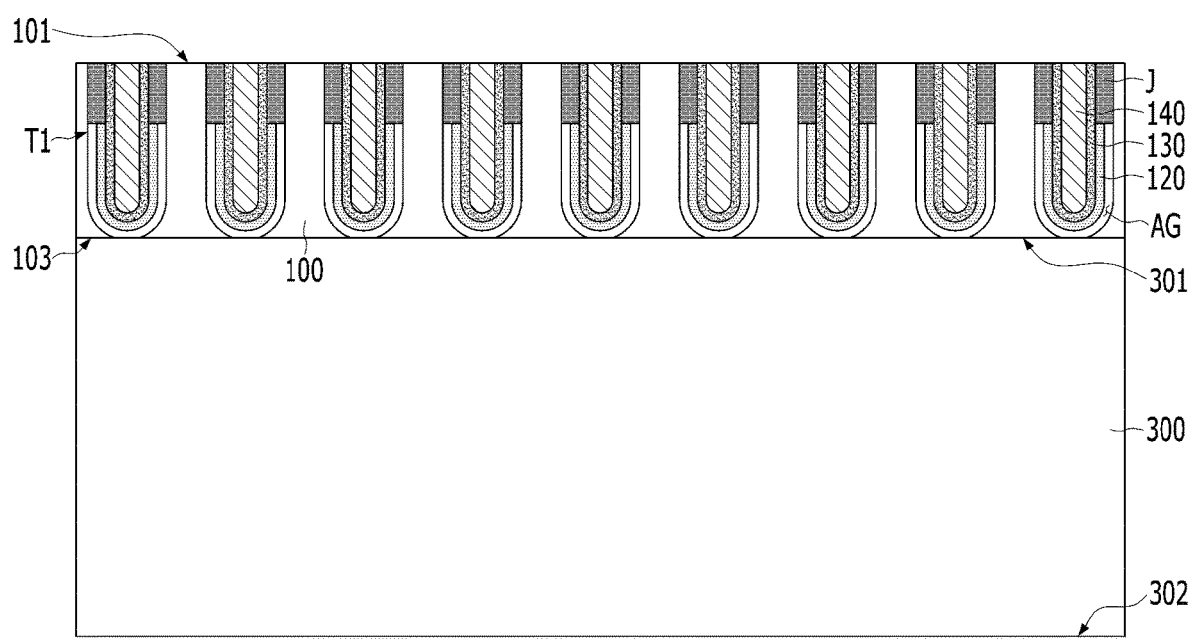
Figure 11:
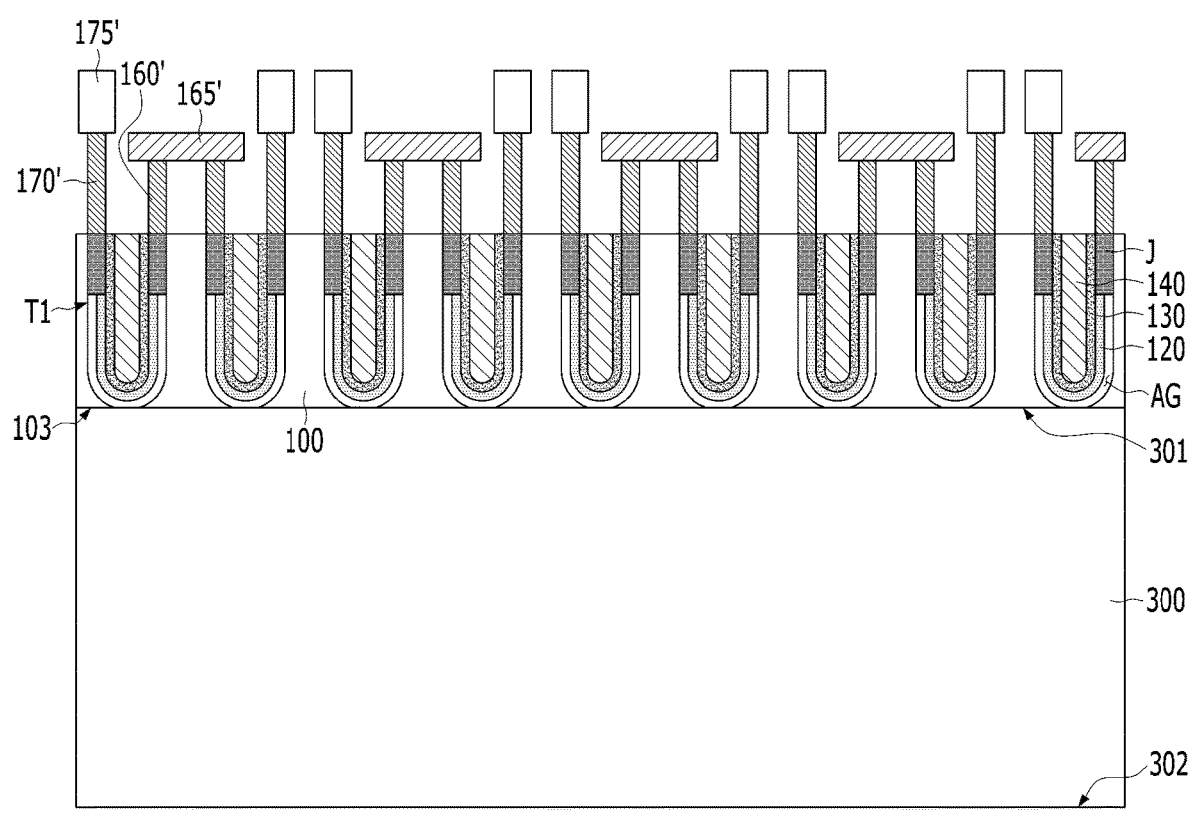

FIGS. 9 to 11 are cross-sectional views illustrating a semiconductor device and a method for fabricating the same according to another embodiment of the present disclosure. In particular, FIGS. 9 to 11 may be for illustrating an example for securing a junction region larger than that of the above-described embodiment.

Referring to FIG. 9, after performing substantially the same processes as in FIGS. 2 to 6, an additional semiconductor layer 180 filling an upper portion of the air gap AG may be formed.

The additional semiconductor layer 180 may be for providing a junction region of the transistor together with the semiconductor layer 120, and may include various semiconductor materials. The additional semiconductor layer 180 may be formed of the same material as the semiconductor layer 120. For example, the additional semiconductor layer 180 may include an undoped semiconductor material or a lightly doped semiconductor material. Also, the additional semiconductor layer 180 may be formed using a deposition method having poor gap-fill characteristics. This is because, in such a case, the remaining portion of the air gap AG can be maintained while only the upper portion of the air gap AG is filled. For example, the additional semiconductor layer 180 may include a layer formed by a physical vapor deposition (PVD) method, or an un-doped silicate glass (USG) layer formed by a $SiH_4$-based plasma enhanced chemical vapor deposition (PECVD) method.

The additional semiconductor layer 180 may be formed to have a thickness having a lower surface substantially at the same level as a lower surface of a junction region (refer to J of FIG. 10) to be described later, but the present disclosure is not limited thereto. The additional semiconductor layer 180 may be formed to have a smaller thickness or a larger thickness than the junction region J.

Referring to FIG. 10, the junction region J may be formed by doping impurities into the semiconductor layer 120 and the additional semiconductor layer 180. Doping of the impurities may be performed using a mask pattern exposing the semiconductor layer 120 and the additional semiconductor layer 180, or may be performed without a mask pattern. In one embodiment, the junction region J may be formed by doping the upper portion of the semiconductor layer 120 and the entire portion of the additional semiconductor layer 180 with the impurities, but the present disclosure is not limited thereto. When the additional semiconductor layer 180 has a greater thickness than the junction region J, a portion of the additional semiconductor layer 180 may be doped with the impurities. According to one embodiment, the horizontal width of the junction region J may be increased by the additional semiconductor layer 180 compared to the junction region (refer to J of FIG. 8) of the aforementioned embodiment.

Referring to FIG. 11, a bit line contact 160' and a storage node contact 170' respectively connected to the junction region J may be formed. Since the width of the junction region J is enlarged, the connection between the bit line contact 160' and the junction region J and the connection between the storage node contact 170' and the junction region J may be facilitated, and the forming process of the bit line contact 160' and the storage node contact 170' may be facilitated. The bit line 165' may be formed over the bit line contact 160' to connect with the bit line contact 160', and the storage node 175' may be formed over the storage node contact 170' to connect with the storage node contact 170'.

Figure 12:
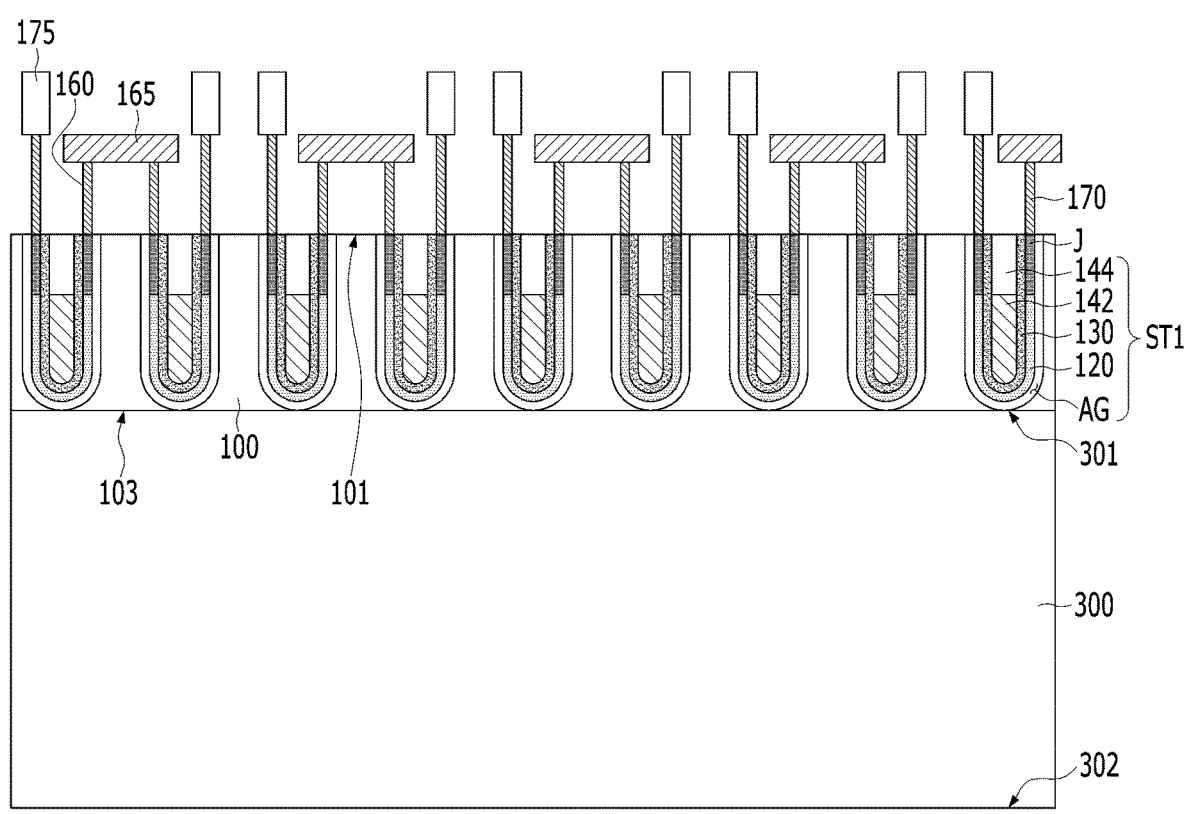
FIG. 12 is a cross-sectional view illustrating a semiconductor device and a method for fabricating the same according to another embodiment of the present disclosure.

FIG. 12 is a cross-sectional view illustrating a semiconductor device and a method for fabricating the same according to another embodiment of the present disclosure. In particular, FIG. 12 shows an example in which a gate electrode is recessed, unlike the above-described embodiments.

Referring to FIG. 12, a gate electrode 142 may have an upper surface lowered by a predetermined degree from a first surface 101 of a first substrate 100. The upper surface of the gate electrode 142 may be positioned at the same or similar level as a lower surface of a junction region J.

The gate electrode 142 may be formed by a recess process in which an upper portion of the gate electrode 140 is removed after the aforementioned gate electrode 140 is formed. The recess process may be performed at any time after the formation of the gate electrode 140 as long as the upper surface of the gate electrode 140 is exposed. For example, the recess process may be performed after the process of FIG. 2 or after the process of FIG. 6.

An empty space formed by the recess of the gate electrode 140 may be filled with a protection layer 144. The protection layer 144 may cover an upper surface of the gate electrode 142 to protect the gate electrode 142, and may include various insulating materials.

According to one embodiment, leakage between the gate electrode 142 and the junction region J may be prevented. If the gate insulating layer 130 is sufficiently thick, leakage between the gate electrode 140 and the junction region J may be prevented, so that the recess process of the gate electrode 140 may not be performed.

Figure 13:
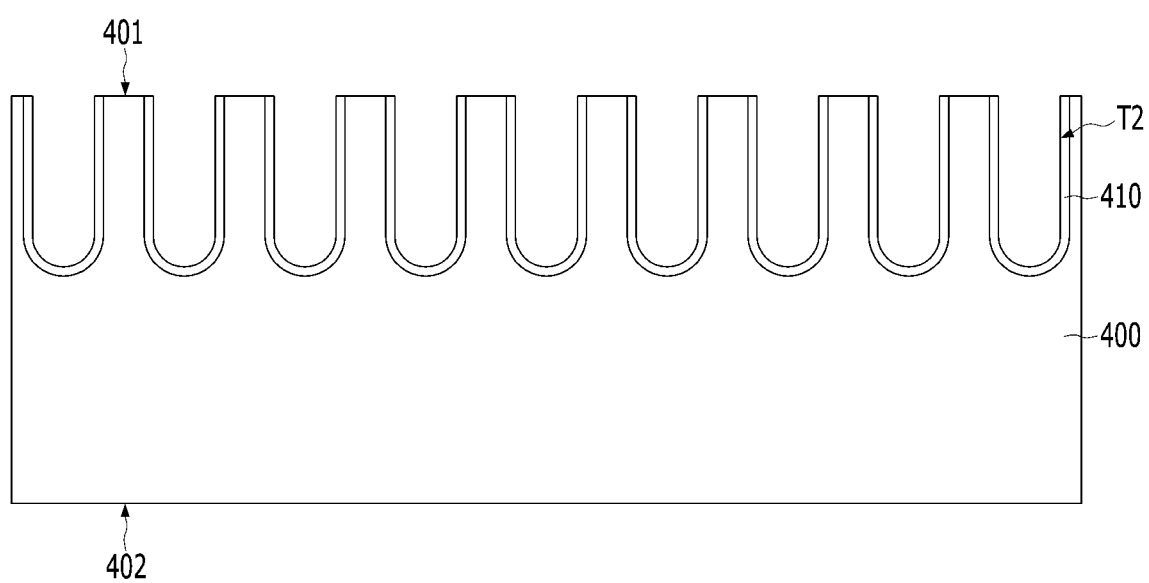
FIGS. 13 and 14 are cross-sectional views illustrating a semiconductor device and a method for fabricating the same according to another embodiment of the present disclosure.
Figure 14:
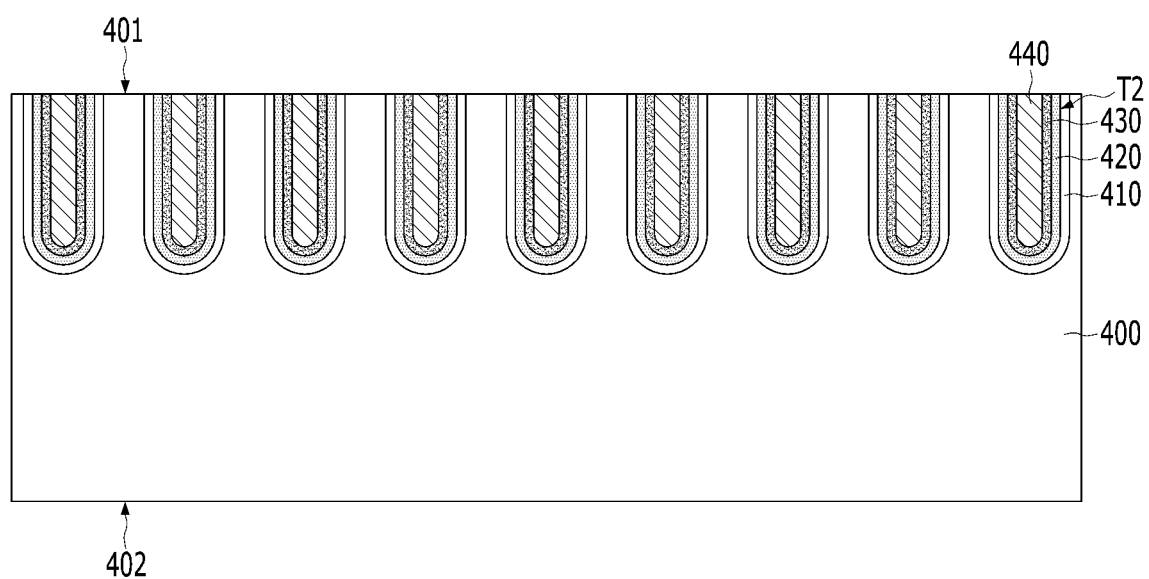

FIGS. 13 and 14 are cross-sectional views illustrating a semiconductor device and a method for fabricating the same according to another embodiment of the present disclosure.

In particular, FIGS. 13 and 14 show another example of a method of forming a sacrificial layer.

Referring to FIG. 13, after a trench T2 is formed in a first substrate 400, a portion of the first substrate 400 exposed by a surface of the trench T2 may be doped with a high concentration of impurities, thereby forming a sacrificial layer 410. Doping of the impurities may be performed in a direction toward the surface of the trench T2, and may be performed by ion implantation, plasma doping, or the like.

As a result of this process, the sacrificial layer 410 may be formed to a predetermined thickness from the trench T2 toward the outside of the trench T2, that is, toward the first substrate 400. Although the sacrificial layer 410 is formed outside the trench T2, it may be formed along the surface of the trench T2. In addition, since the sacrificial layer 410 is formed by doping the first substrate 400 with the impurities, it may include the same semiconductor material as the first substrate 400. For example, when the first substrate 400 includes silicon, the sacrificial layer 410 may include silicon doped with impurities, for example, doped with boron.

Referring to FIG. 14, the semiconductor layer 420, the gate insulating layer 430, and the gate electrode 440 may be sequentially formed to fill the trench T2. Since the sacrificial layer 410 is formed along trench T2, similarly to the above-described embodiments, the semiconductor layer 420, the gate insulating layer 430, and the gate electrode 440 may be formed over the sacrificial layer 410.

Subsequent processes may be substantially the same as in the above-described embodiments, and thus detailed descriptions thereof will be omitted.

According to the above embodiments of the present disclosure, it may be possible to provide a semiconductor device capable of reducing parasitic capacitance and improving operating characteristics while reducing the size of the semiconductor device, and a method for fabricating the same.

Although various embodiments have been described for illustrative purposes, it will be apparent to those skilled in the art that various changes and modifications may be made without departing from the spirit and scope of the present teachings.

What is claimed is:

1. A method for fabricating a semiconductor device, comprising:
   forming a trench in a first substrate to a predetermined depth from a first surface of the first substrate;
   forming a sacrificial layer along a surface of the trench;
   sequentially forming a semiconductor layer, a gate insulating layer, and a gate electrode in the trench;
   forming an insulating layer over the first surface of the first substrate;
   bonding the insulating layer to a second substrate;
   thinning the first substrate from a second surface opposite to the first surface of the first substrate to expose the sacrificial layer;
   forming an air gap by removing the sacrificial layer;
   bonding the thinned surface of the first substrate to a third substrate; and
   removing the second substrate.

2. The method according to claim 1, wherein the sacrificial layer includes a semiconductor material doped with impurities having a higher concentration than that of the first substrate and the semiconductor layer.

3. The method according to claim 1, wherein the forming of the sacrificial layer includes depositing the sacrificial layer along the surface of the trench.

4. The method according to claim 1, wherein the forming of the sacrificial layer includes doping impurities into a portion of the first substrate toward the surface of the trench.

5. The method according to claim 1, wherein the forming of the semiconductor layer is performed by an epitaxial growth process.

6. The method according to claim 1, wherein the thinning of the first substrate is performed by a polishing process, a grinding process, or a combination thereof.

7. The method according to claim 1, wherein the removing of the sacrificial layer is performed by an etching method having a higher etch rate for the sacrificial layer than for the first substrate, the semiconductor layer, or the insulating layer.

8. The method according to claim 1, further comprising:
   forming a junction region by doping the semiconductor layer with impurities, after removing the second substrate.

9. The method according to claim 8, wherein the junction region includes two junction regions, and
   the method further comprising:
   forming a bit line connected to one of the two junction regions through a bit line contact and a storage node connected to another of the two junction regions through a storage node contact, after forming the junction region.

10. The method according to claim 1, wherein the air gap is interposed between the first substrate and the semiconductor layer and between the third substrate and the semiconductor layer.

11. The method according to claim 1, wherein the semiconductor layer, the gate insulating layer, and the gate electrode have respective first surfaces facing the same direction as the first surface of the first substrate,
   the gate insulating layer surrounds a remaining surface of the gate electrode, except for the first surface of the gate electrode,
   the semiconductor layer surrounds a remaining surface of the gate insulating layer, except for the first surface of the gate insulating layer and a surface in contact with the gate electrode of the gate insulating layer, and
   the air gap surrounds a remaining surface of the semiconductor layer, except for the first surface of the semiconductor layer and a surface in contact with the gate insulating layer of the semiconductor layer.

12. The method according to claim 11, wherein the forming of the insulating layer is performed so as to be in contact with the first surfaces of the semiconductor layer, the gate insulating layer, and the gate electrode while being in contact with the air gap.

13. The method according to claim 1, wherein a thickness of a structure including the semiconductor layer, the gate insulating layer, the gate electrode, and the air gap is the same as a thickness of the thinned first substrate.

14. The method according to claim 1, further comprising:
   forming an additional semiconductor layer filling an upper portion of the air gap.

15. The method according to claim 14, further comprising:
   forming a junction region by doping impurities into the semiconductor layer and the additional semiconductor layer, after forming the additional semiconductor layer.

16. The method according to claim 1, further comprising:
   lowering a first surface of the gate electrode to be lower than the first surface of the first substrate, after forming the gate electrode.

* * * * *